United States Patent
Yang et al.

(10) Patent No.: US 8,785,922 B2
(45) Date of Patent: Jul. 22, 2014

(54) THIN FILM TRANSISTOR, ORGANIC LUMINESCENCE DISPLAY INCLUDING THE SAME, AND METHOD OF MANUFACTURING THE ORGANIC LUMINESCENCE DISPLAY

(75) Inventors: Hui-Won Yang, Yongin (KR); Eun-Hyun Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 162 days.

(21) Appl. No.: 13/415,776

(22) Filed: Mar. 8, 2012

(65) Prior Publication Data

US 2012/0256176 A1 Oct. 11, 2012

(30) Foreign Application Priority Data

Apr. 6, 2011 (KR) ........................ 10-2011-0031800

(51) Int. Cl.
*H01L 29/10* (2006.01)
*H01L 21/00* (2006.01)
*H01L 29/786* (2006.01)

(52) U.S. Cl.
CPC .................................. *H01L 29/7869* (2013.01)
USPC .............................................. 257/43; 438/34

(58) Field of Classification Search
CPC .. H01L 29/7869; H01L 33/62; H01L 27/1214
USPC ........ 257/43, E33.062, E29.273; 438/34, 104
See application file for complete search history.

(56) References Cited

U.S. PATENT DOCUMENTS

| | | | |
|---|---|---|---|
| 6,573,564 B2 | 6/2003 | Yamazaki et al. | |
| 6,972,825 B2* | 12/2005 | Kim .............................. | 349/192 |
| 2010/0181563 A1 | 7/2010 | Kim et al. | |
| 2011/0193076 A1* | 8/2011 | Yun et al. ........................ | 257/43 |
| 2011/0303918 A1* | 12/2011 | Im ................................... | 257/59 |

FOREIGN PATENT DOCUMENTS

| | | |
|---|---|---|
| KR | 10-2001-0003189 A | 1/2001 |
| KR | 10-0557698 B1 | 3/2006 |
| KR | 10-0583421 B1 | 5/2006 |
| KR | 10-2010-0085331 A | 7/2010 |

* cited by examiner

*Primary Examiner* — Fernando L Toledo
*Assistant Examiner* — Neil Prasad
(74) *Attorney, Agent, or Firm* — Knobbe, Martens, Olson & Bear, LLP

(57) ABSTRACT

A thin film transistor (TFT) including a substrate; a gate electrode formed over the substrate, an active layer insulated from the gate electrode by using a gate insulation film; an etch stop layer which is formed over the active layer and includes first and second holes for exposing the active layer; a first electrode; and a second electrode including a first part and a second part. The first part is formed over the etch stop layer, and the second part is received in the second hole, contacts the active layer directly, and connects the first part to the active layer. At least one portion of the first part of the second electrode overlaps with the gate electrode. The second part of the second electrode does not overlap with and is separated from the gate electrode.

18 Claims, 6 Drawing Sheets

THIN FILM TRANSISTOR, ORGANIC LUMINESCENCE DISPLAY INCLUDING THE SAME, AND METHOD OF MANUFACTURING THE ORGANIC LUMINESCENCE DISPLAY

CROSS-REFERENCE TO RELATED PATENT APPLICATION

This application claims the benefit of Korean Patent Application No. 10-2011-0031800, filed on Apr. 6, 2011, in the Korean Intellectual Property Office, the disclosure of which is incorporated herein in its entirety by reference.

BACKGROUND

1. Field

The present disclosure relates to a thin film transistor (TFT) having a structure for minimizing a reduction in a drain current, an organic luminescence display including the TFT, and a method of manufacturing the organic luminescence display.

2. Description of the Related Art

When operating a large-sized organic luminescence display, a parasitic capacitance of a thin film transistor (TFT) in the organic luminescence display may increase and it may cause a resistance-capacitance (RC) signal delay to increase.

Such a signal delay may cause a delay in "on" and "off" times of the TFT. Consequently, a signal in a next phase may be input before a pixel is completely charged or discharged, thereby deteriorating the video quality of a panel. In order to solve this problem, a TFT having an offset structure may be employed. However, in the case of such a TFT, a drain current may drastically decrease as a source/drain series resistance increases.

SUMMARY

One or more aspects of the invention provide a TFT having a structure that increases a drain current and decreases a parasitic capacitance simultaneously.

One or more aspects of the present invention provide a thin film transistor (TFT), in which a back channel is formed to prevent a reduction in a drain current, an organic luminescence display including the TFT, and a method of manufacturing the organic luminescence display.

According to an aspect of the present invention, there is provided a thin film transistor including a substrate; a gate electrode formed over the substrate; an active layer insulated from the gate electrode by using a gate insulating film; an etch stop layer which is formed over the active layer and includes a first hole and a second hole for exposing the active layer; a first electrode including a first part and a second part, wherein the first part is formed over the etch stop layer, and the second part is received in the first hole, contacts the active layer directly, and connects the first part to the active layer; a first part and a second part, wherein the first part is formed over the etch stop layer, and the second part is received in the second hole, contacts the active layer directly, and connects the first part to the active layer. At least one portion of the first part of the first electrode and the second part of the first electrode overlap with the gate electrode. At least one portion of the first part of the second electrode overlaps with the gate electrode. The second part of the second electrode does not overlap with and is separated from the gate electrode. Both the first and the second electrodes may overlap with the active layer.

The first hole may be formed to overlap with the gate electrode, and the second hole may be formed not to overlap with and is separated from the gate electrode.

The active layer may include an oxide semiconductor.

The oxide semiconductor may further include at least one selected from the group consisting of indium (In), gallium (Ga), stanium (Sn), zirconium (Zr), vanadium (V), hafnium (Hf), zinc (Zn), and a combination thereof.

A buffer layer may be formed between the substrate and the gate electrode.

The active layer may be configured to form a back channel at a region of the active layer which overlaps with the first part of the second electrode but does not overlap with the gate electrode.

According to another aspect of the present invention, there is provided an organic luminescence display including a substrate; a gate electrode formed over the substrate; an active layer insulated from the gate electrode by using a gate insulating film; an etch stop layer which is formed over the active layer and includes a first hole and a second hole for exposing the active layer; a first electrode including a first part and a second part, wherein the first part is formed over the etch stop layer, and the second part is received in the first hole, contacts the active layer directly, and connects the first part to the active layer; a second electrode including a first part and a second part, wherein the first part is formed over the etch stop layer, and the second part is received in the second hole, contacts the active layer directly, and connects the first part to the active layer; a pixel electrode connected to either the first electrode or the second electrode; an opposite electrode facing the pixel electrode; an organic luminescence layer formed between the pixel electrode and the opposite electrode. At least one portion of the first part of the first electrode and the second part of the first electrode overlap with the gate electrode. At least one portion of the first part of the first electrode and the second part of the first electrode overlap with the gate electrode. The second part of the second electrode does not overlap with and is separated from the gate electrode.

Both the first and the second electrodes may overlap with the active layer.

The first hole may be formed to overlap with the gate electrode, and the second hole may be formed not to overlap with and is separated from the gate electrode.

The active layer may include an oxide semiconductor.

The oxide semiconductor may include at least one selected from the group consisting of indium (In), gallium (Ga), stanium (Sn), zirconium (Zr), vanadium (V), hafnium (Hf), zinc (Zn), and a combination thereof.

A buffer layer may be formed between the substrate and the gate electrode.

The active layer may be configured to form a back channel at a region of the active layer which overlaps with the first part of the second electrode but does not overlap with the gate electrode.

According to another aspect of the present invention, there is provided a method of manufacturing an organic luminescence display, the method including providing a substrate; forming a gate electrode over the substrate; forming an active layer which is insulated from the gate electrode by a gate insulation film; forming an etch stop layer over the active layer, the etch stop layer including a first hole and a second hole for exposing the active layer; forming a first electrode including a first part and a second part, wherein the first part is formed over the etch stop layer, and the second part which is received in the first hole, contacts the active layer directly, and connects the first part to the active layer; forming a second electrode including a first part and a second part, wherein the first part is formed the etch stop layer, and the second part is received in the second hole, contacts the active layer directly, and connects the first part to the active layer; forming a pixel electrode connected to either the first electrode or the second electrode; forming an opposite electrode facing the pixel electrode; forming an organic luminescence layer between the pixel electrode and the opposite electrode. At least one portion of the first part of the first electrode and the second part of the first electrode overlap the gate electrode. The first part of the second electrode at least partially overlaps with the gate electrode. The second part of the second electrode does not overlap with and is separated from the gate electrode.

Both the first electrode and the second electrode may overlap with the active layer.

The first hole may be formed to overlap with the gate electrode, and the second hole may be formed not to overlap with and is separated from the gate electrode.

The active layer may include an oxide semiconductor.

The oxide semiconductor may include at least one selected from the group consisting of indium (In), gallium (Ga), stanium (Sn), zirconium (Zr), vanadium (V), hafnium (Hf), zinc (Zn), and a combination thereof.

A buffer layer may be formed between the substrate and the gate electrode.

BRIEF DESCRIPTION OF THE DRAWINGS

The above and other features of the present invention will become more apparent by describing in detail embodiments thereof with reference to the attached drawings in which.

DETAILED DESCRIPTION OF EMBODIMENTS

Hereinafter, embodiments of the present invention will be described fully with reference to the accompanying drawings. It should be understood, however, that there is no intent to limit the present invention to these embodiments, but on the contrary, the embodiments are to cover all modifications, equivalents, and alternatives falling within the scope of the invention.

Although the terms, 'first', 'second', 'third', etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" and/or "include," when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described in detail with reference to the attached drawings.

Figure 1:
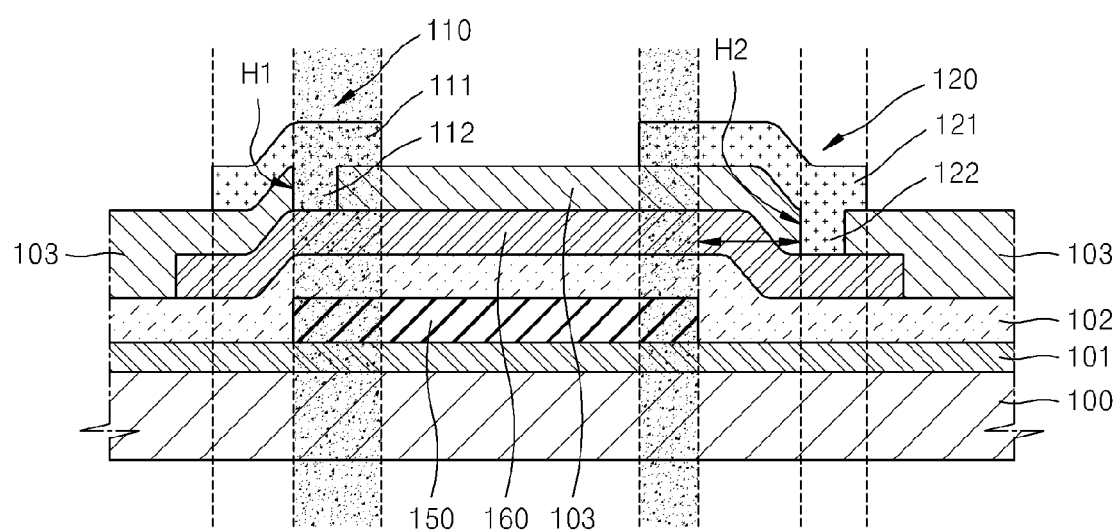
FIG. 1 is a cross-sectional view of a thin film transistor (TFT) according to an embodiment of the present invention.

FIG. 1 is a cross-sectional view of a thin film transistor (TFT) according to an embodiment of the present invention.

Referring to FIG. 1, the TFT includes a gate electrode 150 formed over a substrate 100, an active layer 160 insulated from the gate electrode 150 by using a gate insulating film 102, an etch stop layer 103 formed on the active layer 160, and a first electrode 110 and a second electrode 120 that are formed on the etch stop layer 103 and connected to the active layer 160. The first electrode 110 may be a source electrode and the second electrode 120 may be a drain electrode, or vice versa.

The substrate 100 may be formed to have a flat upper surface by using an insulating or transparent material. A buffer layer 101 may further be formed on the substrate 100 to prevent spread of impurities and planarize the upper surface of the substrate 100. The buffer layer 101 may include a silicon oxide or a silicon nitride.

The gate electrode 150 is disposed on the buffer layer 101. The gate insulating film 102 is disposed on the gate electrode 150. The gate insulation film is formed to entirely cover an upper surface of the gate electrode 150 and the buffer layer 101. The gate insulating film 102 insulates the gate electrode 150 and the active layer 160 from each other.

The active layer 160 is disposed on the gate insulating film 102. The active layer 160 is formed in a position which corresponds to the gate electrode 150. As illustrated in FIG. 1, the active layer 160 is wider than the gate electrode 150. In one embodiment, the gate electrode 150 may be eclipsed by the active layer 160 when viewed in a thickness direction generally perpendicular to the substrate 100. The active layer 160 may include an oxide semiconductor. The oxide semiconductor may include at least one selected from the group consisting of indium (In), gallium (Ga), stanium (Sn), zirconium (Zr), vanadium (V), hafnium (Hf), zinc (Zn) and a combination thereof. For example, the oxide semiconductor may be a mixture of Ga, In, and Zn in an atomic percentage ratio (atom %) of 2:2:1 but is not limited thereto and may be formed of at least one selected from the group consisting of InGaZnO, $SnO_2$, $In_2O_3$, ZnO, CdO, $Cd_2SnO_4$, $TiO_2$, $Ti_3N_4$, and a combination thereof. If the active layer 160 is formed of an oxide semiconductor, then a TFT may be manufactured through a low-temperature process, may be easy to manufacture in a large size since the oxide semiconductor is amorphous, and may have good electrical characteristics.

The etch stop layer 103 is formed on the active layer 160. The etch stop layer 103 may be formed by using an insulating material, such as a silicon oxide or a silicon nitride. The etch stop layer 103 may be formed to a thickness of several tens through several hundreds of angstroms (Å). The etch stop layer 103 is formed to entirely cover an upper surface of the active layer 160 and a surface of the exposed gate insulating film 102. A first hole H1 and a second hole H2 are formed in the etch stop layer 103, thus exposing the active layer 160 below the etch stop layer 103. In one embodiment, the first hole H1 is formed to overlap with the gate electrode 150 below the etch stop layer 103 when viewed in the thickness direction generally perpendicular to the substrate 100. On the contrary, the second hole H2 is formed not to overlap with and is separated from the gate electrode 150 below the etch stop layer 103. That is, the second hole H2 is formed to have an offset with the gate electrode 150.

In one embodiment, the entire first electrode 110 is formed to overlap with the active layer 160 when viewed in the thickness direction. The first electrode 110 includes a first part 111 and a second part 112. The first part 111 is formed on the etch stop layer 103. The second part 112 is a contact part connecting the first part 111 to the active layer 160. The first hole H1 is filled with the second part 112 and the second part 112 contacts the active layer 160 directly. In the first electrode 110, at least one portion of the first part 111 is formed to overlap with the gate electrode 150 and the second part 112 entirely overlaps with the gate electrode 150 when viewed in the thickness direction.

In one embodiment, the entire second electrode 120 is formed to overlap with the active layer 160 when viewed in the thickness direction. The second electrode 120 includes a first part 121 and a second part 122, similar to the first electrode 110. The first part 121 is disposed on the etch stop layer 103. The second part 122 is a contact part for connecting the first part 121 to the active layer 160. The second part 122 is charged in the second hold H2 and contacts the active layer 160 directly. At least one portion of the first part 121 of the second electrode 120 is formed to overlap with the gate electrode 150 when viewed in the thickness direction. The second part 122 of the second electrode 120 is formed not to overlap with and is separated from the gate electrode 150.

In the TFT according to embodiments, when a voltage is applied to the gate electrode 150, the gate electrode 150, the gate insulation film 102 and the active layer 160 form a metal oxide semiconductor capacitor (MOS cap). Thus, a main channel in which electrons or holes gather is formed on a portion which corresponds to the gate electron 150 in a channel region of the active layer 160. Specifically, the main channel is formed in the channel region of the active layer 160, as electrons or holes move toward the gate electrode 150 according to a voltage applied to the gate electrode 150. Through this main channel, an electrical current is conducted between the first electrode 110 which is a source electrode and the second electrode 120 which is a drain electrode.

According to an embodiment of the present invention, the first part 121 of the second electron 120 and the active layer 160 overlap with each other having the etch stop layer 103 therebetween. When a voltage is applied to the second electrode 120, the first part 121 of the second electrode 120, the etch stop layer 103 which is a type of an insulation material, and the active layer 160 work as a MOS cap for collecting electrons or holes. The voltage applied to the second electrode 120 may be about 5 through about 10V. As a result, a back channel in which electrons or holes gather is formed on a region of the active layer 160 which overlaps with the first part 121 of the second electrode 120. Particularly, the back channel is formed in a position in which a main channel is not formed. Therefore, the back channel may be formed in a portion of the active layer 160 that overlaps with the first part 121 of the second electrode 120 but does not overlap with the gate electrode 150 (refer to FIG. 2B). According to an experiment, the back channel was formed when the first part 121 of the second electrode 120 was extended to overlap with the gate electrode 150. Thus, in the illustrated embodiment, the first part 121 overlaps with the gate electrode 150.

In the TFT according to an embodiment of the present invention, the second part 122 of the second electrode 120 has an offset with the gate electrode 150. However, the first part 121 of the second electrode 120 is disposed to overlap with the gate electrode 150. Particularly, the first part 121 and the active layer 160 overlap with each other, having the etch stop layer 103 therebetween, thus forming both the back channel and the main channel. Accordingly, the back channel leads to a reduction in a series resistance, thereby minimizing a reduction in a drain current. The second part 122 of the second electrode 120 is formed to have an offset with the gate electrode 150. Accordingly, a parasitic capacitance in the TFT according to the current embodiment is more reduced than in a general TFT in which both a second electrode and a first electrode overlap with a gate electrode.

Figure 2A:
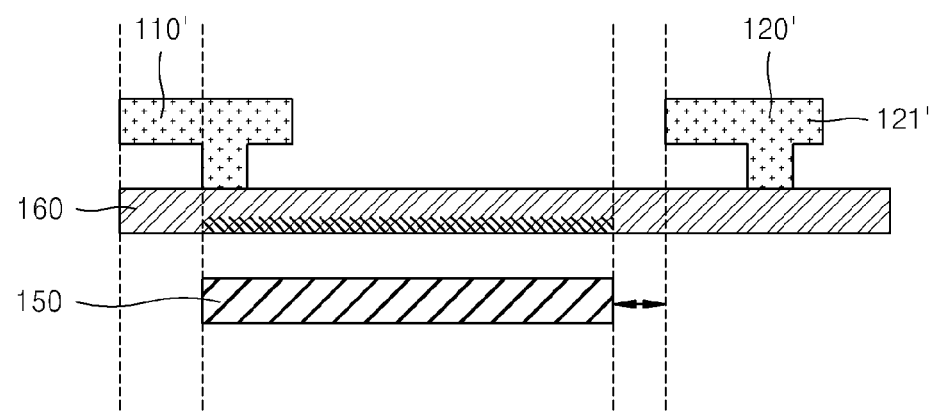
FIG. 2A is a diagram illustrating a status of a channel formed when a comparative example is driven.
Figure 2B:
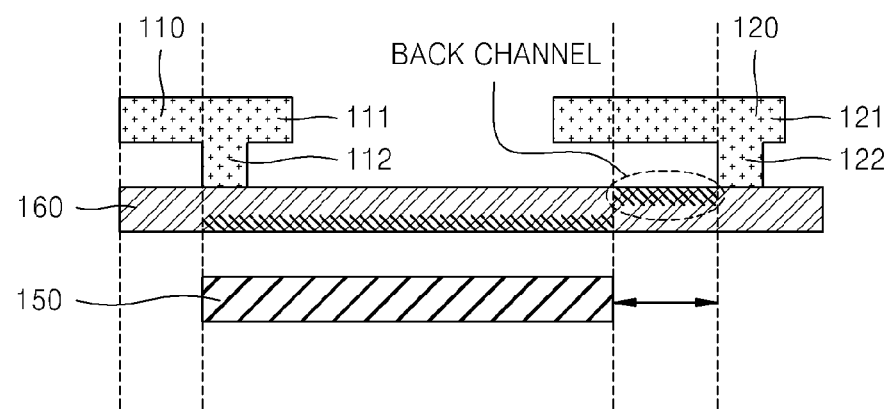
FIG. 2B is a diagram illustrating a status of a channel formed when the TFT of FIG. 1 is driven.

FIG. 2A is a diagram illustrating a status of a channel measured through an experiment when a comparative example is driven. FIG. 2B is a diagram illustrating a status of a channel measured through an experiment when the TFT according to an embodiment illustrated in FIG. 1 is driven. The etch stop layer 103 and the gate insulation layer 102 of FIG. 1 are not illustrated in FIGS. 2A and 2B for convenience of explanation.

Referring to FIG. 2A, unlike a TFT according to an embodiment of the present invention, an upper part 121' of a drain electrode 120' does not overlap with a gate electrode 150. That is, FIG. 2A illustrates a channel formed when a TFT having an offset structure is driven. In the offset structure of the TFT, a source electrode 110' partially overlaps with a gate electrode 150, while the drain electrode 120' does not overlap with and is separated from the gate electrode 150. The experiments reveal that as the drain electrode 120' is separated from the gate electrode 150, a back channel is not formed. Accordingly, the offset structure of FIG. 2A causes an increase in a series resistance and a drastic reduction in a drain current.

FIG. 2B illustrates a channel formed when the TFT of FIG. 1 is driven. In this case, at least one portion of the first portion 121 of the second electrode 120 overlaps with the gate electrode 150. Thus, a back channel is formed in a region in which no main channel is formed, that is, the region in which the gate electrode 150 does not overlap with the active layer 160. The back channel leads to a reduction in a series resistance and prevents a reduction in a drain current, compared to the TFT of FIG. 2A.

Figure 3:
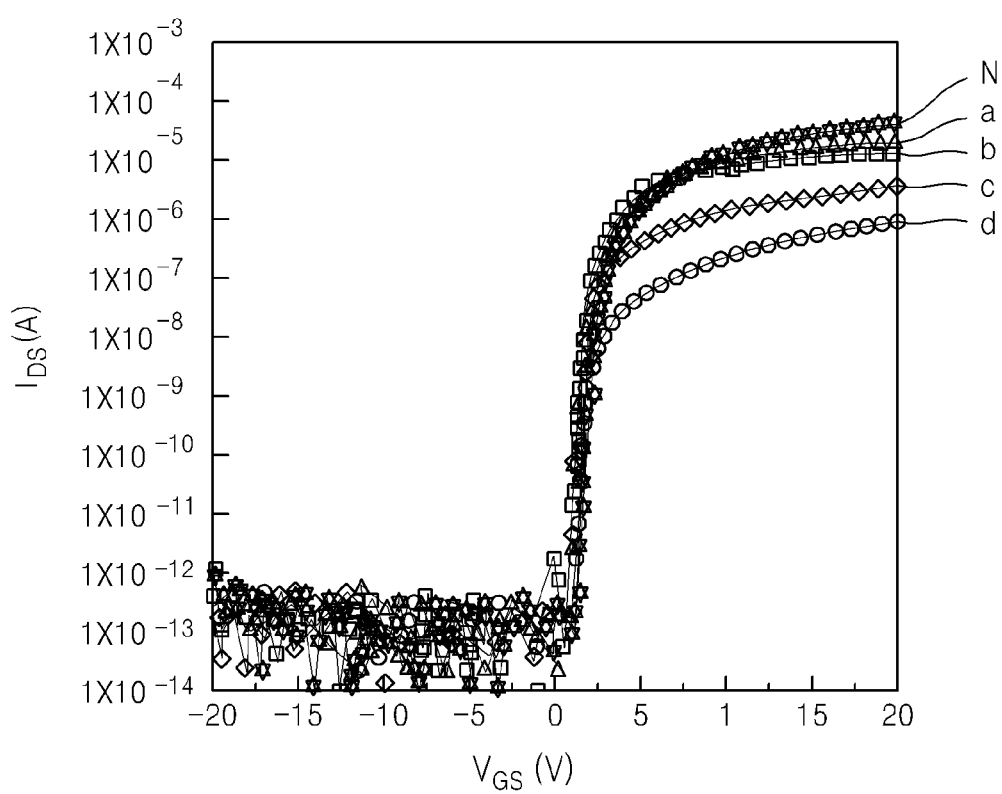
FIG. 3 is a graph showing transfer characteristics of the TFT of FIG. 1 and a comparative example.

FIG. 3 is a graph illustrating transfer characteristics of the TFT of FIG. 1 and a comparative example.

FIG. 3 illustrates a change in a drain current when a drain voltage of about 5.1 V is applied. In FIG. 3, 'N' represents a drain current of a typical TFT that does not have an offset structure. Reference characters 'c' and 'd' represent drain currents of a driven TFT that has the offset structure illustrated in FIG. 2A, in which a drain electrode 120' has an offset with a gate electrode 150. From the graph, it is noted that since a series resistance increases owing to the offset structure, the drain currents c and d are much less than the drain current N.

In FIG. 3, 'a' and 'b' represent drain currents of the TFT of FIG. 1 according to an embodiment of the present invention. Unlike the drain currents c and d, the drain currents 'a' and 'b' are almost equal to the drain current N as at least one portion of the first part 121 of the second electrode 120 overlaps with the gate electrode 150. Consequently, in the TFT of FIG. 1, a drain current is not drastically reduced.

Figure 4A:
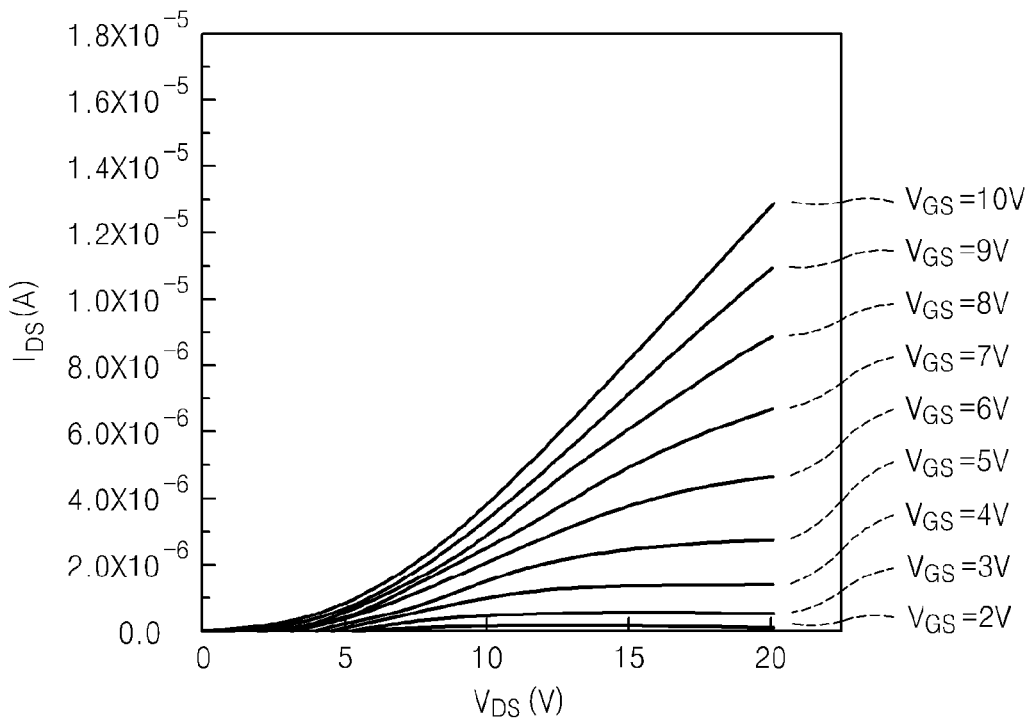
FIG. 4A is a graph showing output characteristics of a comparative example.
Figure 4B:
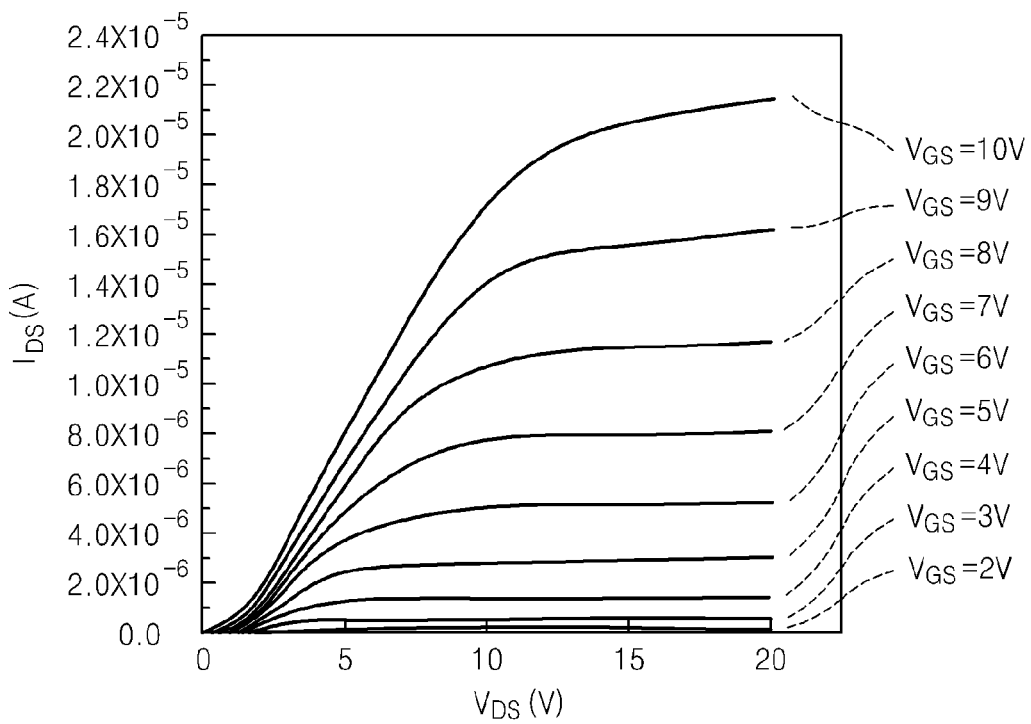
FIG. 4B is a graph showing output characteristics of the TFT of FIG. 1.

FIG. 4A is a graph showing output characteristics of a comparative example, measured through an experiment. FIG. 4B is a graph showing output characteristics of the TFT of FIG. 1, measured through an experiment. Specifically, FIG. 4A illustrates a drain current of a TFT having the offset structure of FIG. 2A, in which the drain electrode 120' has an offset with the gate electrode 150. Referring to FIG. 4A, the offset structure increases a series resistance, thus causing current crowding, and saturation characteristics are not observed.

FIG. 4B illustrates a drain current of the TFT of FIG. 1 according to an embodiment of the present invention. Referring to FIG. 4B, unlike FIG. 4A, high drain currents and saturation characteristics of a drain current are observed.

As noted from the above experiments, since a back channel is formed in the TFT of FIG. 1, a series resistance decreases, thereby minimizing a reduction in a drain current.

Figure 5:
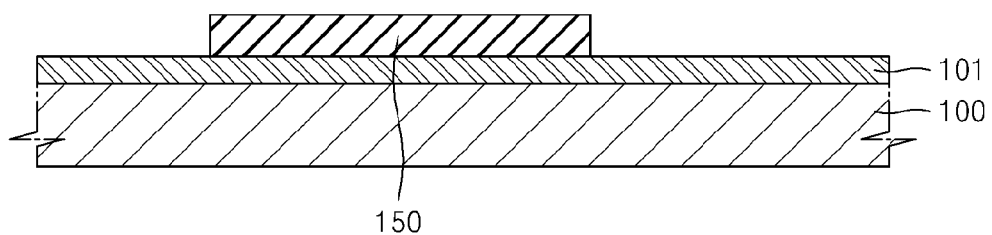
FIGS. 5 through 8 are cross-sectional views for explaining a method of manufacturing an organic luminescence display including the TFT of FIG. 1, according to an embodiment of the present invention.
Figure 6:
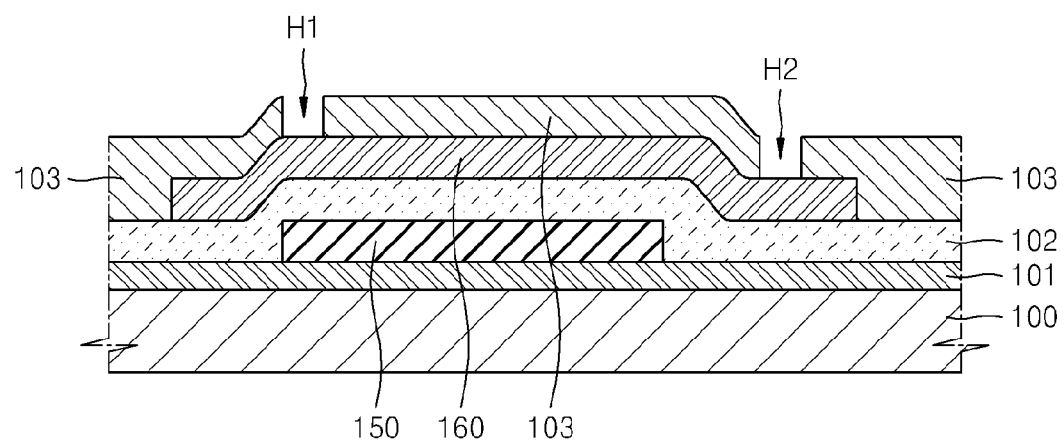
Figure 7:
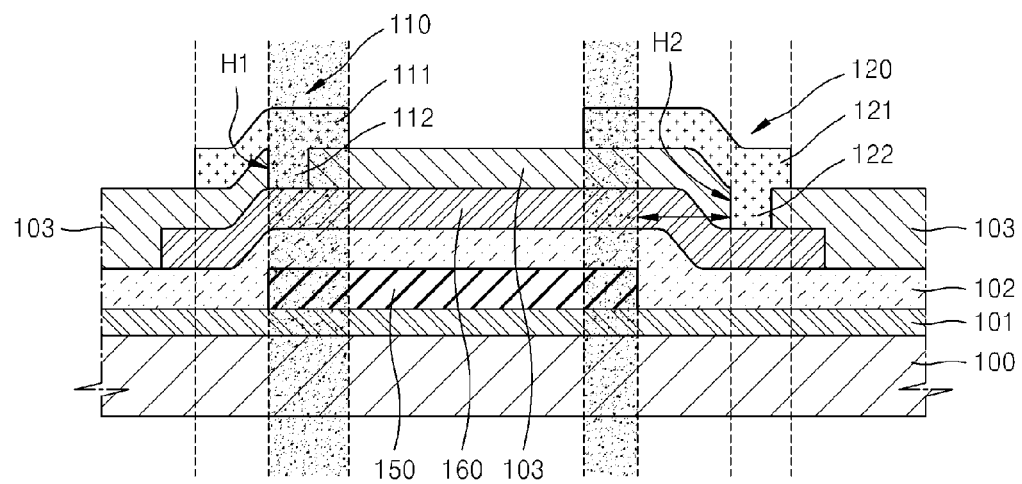
Figure 8:
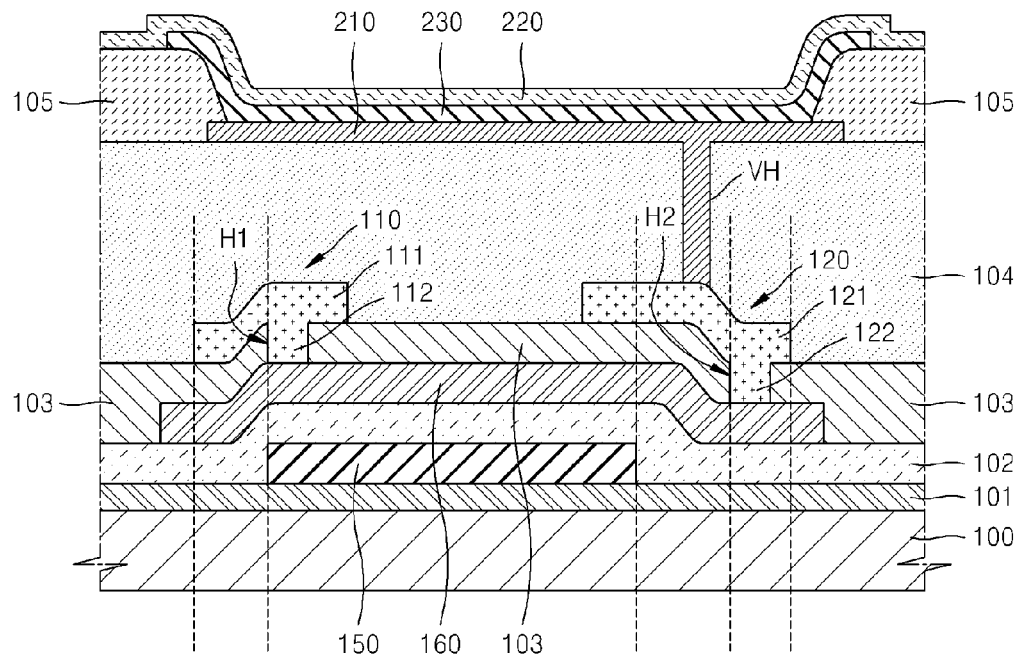

FIGS. 5 through 8 are cross-sectional views for explaining a method of manufacturing an organic luminescence display including the TFT of FIG. 1, according to an embodiment of the present invention. Particularly, FIGS. 5 through 7 illustrate a method of manufacturing the TFT of FIG. 1. FIG. 8 illustrates a method of manufacturing an organic luminescence display by connecting an organic luminescence diode to the resultant structure of FIG. 7.

Referring to FIG. 5, a buffer layer 101 is formed on a substrate 101. The buffer layer 101 may be obtained by depositing an inorganic material by plasma enhanced chemical vapour deposition (PECVD), atmospheric chemical vapour deposition (APCVD), or low-pressure CVD (LPCVD). A gate electrode 150 is formed on the buffer layer 101. The gate electrode 150 may be manufactured by forming a conductive layer and patterning the conductive layer in the form of a gate electrode.

Referring to FIG. 6, a gate insulating film 102 is formed on the gate electrode 150. The gate insulating film 102 may be formed by depositing an organic or inorganic material by PECVD, APCVD, or LPCVD. An active layer 160 is formed on the gate insulating film 102. The active layer 160 may include an oxide semiconductor. An etch stop layer 103 is formed on the active layer 160. The etch stop layer 103 may be formed by depositing an organic or inorganic substance by PECVD, APCVD, or LPCVD. First and second holes H1 and H2 are formed in the etch stop layer 103 to expose the active layer 160. The first hole H1 is formed to overlap with the gate electrode 150. The second hole H2 is formed not to overlap with and is separated from the gate electrode 150.

Referring to FIG. 7, a first electrode 110 and a second electrode 120 are formed on the etch stop layer 103. The first electrode 110 includes a second part 112 for filling the first hole H1, and a first part 111 formed on the second part 112. The first part 111 is patterned in such a manner that at least a part thereof may overlap with the gate electrode 150. The second electrode 120 includes a second part 122 for filling a second hole H2, and a first part 121 formed on the second part 122. The first part 121 is patterned in such a manner that at least a part thereof may overlap with the gate electrode 150. Both the first and second electrodes 110 and 120 are patterned to overlap with the active layer 160.

FIG. 8 illustrates an example in which the TFT of FIG. 1 serves as a driving transistor of an organic luminescence display. A drain current is prevented from being reduced in the TFT of FIG. 1. Since an organic luminescence diode of an organic luminescence display emits light according to a drain current of a driving transistor, the TFT of FIG. 1 may be used as a driving transistor.

Referring to FIG. 8, a planarization layer is further formed on the TFT of FIG. 7. The planarization layer 104 planarizes a surface of the TFT of FIG. 7. The planarization layer 104 is formed of at least one selected from the group consisting of polyacrylates resin, epoxy resin, phenolic resin, polyamides resin, polyimides resin, unsaturated polyesters resin, polyphenylenethers resin, polyphenylenesulfides resin, benzocyclobutene (BCB), and a combination thereof. The planarization layer 104 may include a via hole VH for electrically connecting a pixel electrode 210 to either the first electrode 110 or the second electrode 120 of the TFT. In an embodiment illustrated in FIG. 8, the pixel electrode 210 is connected to the second electrode 120.

The pixel electrode 210 is formed on the planarization layer 104. The pixel electrode 210 acts as an anode electrode of an organic luminescence diode. The pixel electrode 210 is connected to the TFT via the via hole VH. A pixel definition film 105 is formed on the pixel electrode 210. The pixel definition film 105 may be formed by using resin, such as polyimides, or a silica-based inorganic material. The pixel definition film 105 may have an opening for exposing the pixel electrode 210.

An organic luminescence layer 230 is formed on the exposed pixel electrode 210. An opposite electrode 220 is insulated from the pixel electrode 210 via the organic luminescence layer 230. The opposed electrode 220 may work as a cathode electrode. The pixel electrode 210 and the opposite electrode 220 respectively apply voltages with different polarities to the organic luminescence layer 230 so that the organic luminescence layer 230 may emit light.

A polymer organic film or a low-molecular weight organic film may be employed as the organic luminescence layer 230. The organic luminescence layer 230 may be formed by laminating a hole injection layer (HIL), a hole transport layer (HTL), an emission layer (EML), an electron transport layer (ETL), or an electron injection layer (EIL) in a single or multiple structure. Various organic materials, such as a copper phthalocyanine (CuPc), a N,N'-Di (naphthalene-1-yl)-N, N'-diphenyl-benzidine (NPB), or a tris-8-hydroxyquinoline aluminium (Alq3), may be used to form the organic luminescence layer 230.

An organic luminescence display according to an embodiment of the present invention may be, but are not limited to, a bottom-emission type, a top-emission type, or a dual-emission type. The organic luminescence display may also be a transparent organic luminescence display having a transmission window for transmitting light.

A TFT according to an embodiment of the present invention is applied not only to an organic luminescence display but also to any other type of flat panel displays, such as a liquid crystal display, which employs a TFT.

According to the above embodiments of the present invention, a drain electrode is formed to overlap with an active layer. A first part of the drain electrode at least partially overlaps with a gate electrode, and a second part of the drain electrode does not overlap with and is separated from the gate electrode, thus a back channel is formed in an active layer. The back channel reduces a series resistance, thus minimizing a reduction in a drain current. Also, an output drain current exhibits saturation characteristics.

While embodiments of the present invention have been particularly shown and described, it will be understood by those of ordinary skill in the art that various changes in form and details may be made therein without departing from the spirit and scope of the present invention as defined by the following claims.

What is claimed is:
1. A thin film transistor (TFT) comprising:
 a substrate;
 a gate electrode formed over the substrate;
 an active layer insulated from the gate electrode by using a gate insulation film;
 an etch stop layer which is formed over the active layer and comprises a first hole and a second hole for exposing the active layer;

a first electrode comprising a first part and a second part, wherein the first part is formed over the etch stop layer, and the second part is received in the first hole, contacts the active layer directly, and connects the first part to the active layer; and a second electrode comprising a first part and a second part, wherein the first part is formed over the etch stop layer, and the second part is received in the second hole, contacts the active layer directly, and connects the first part to the active layer, wherein at least one portion of the first part of the first electrode and the second part of the first electrode overlap with the gate electrode, at least one portion of the first part of the second electrode overlaps with the gate electrode, and the second part of the second electrode does not overlap with and is separated from the gate electrode.

2. The TFT of claim 1, wherein both the first and the second electrodes overlap with the active layer.

3. The TFT of claim 1, wherein the first hole is formed to overlap with the gate electrode, and the second hole is formed not to overlap with and is separated from the gate electrode.

4. The TFT of claim 1, wherein the active layer comprises an oxide semiconductor.

5. The TFT of claim 4, wherein the oxide semiconductor comprises at least one selected from the group consisting of indium (In), gallium (Ga), stanium (Sn), zirconium (Zr), vanadium (V), hafnium (Hf), zinc (Zn), and a combination thereof 6. The TFT of claim 1, wherein the active layer is configured to form a back channel at a region of the active layer which overlaps with the first part of the second electrode but does not overlap with the gate electrode.

7. An organic luminescence display comprising:
a substrate;
a gate electrode formed over the substrate;
an active layer insulated from the gate electrode by using a gate insulation film;
an etch stop layer which is formed over the active layer and comprises a first hole and a second hole for exposing the active layer;
a first electrode comprising a first part and a second part, wherein the first part is formed over the etch stop layer, and the second part is received in the first hole, contacts the active layer directly, and connects the first part to the active layer;
a second electrode comprising a first part and a second part, wherein the first part is formed over the etch stop layer, and the second part is received in the second hole, contacts the active layer directly, and connects the first part to the active layer;
a pixel electrode connected to either the first electrode or the second electrode;
an opposite electrode facing the pixel electrode;
an organic luminescence layer formed between the pixel electrode and the opposite electrode,
wherein at least one portion of the first part of the first electrode and the second part of the first electrode overlap with the gate electrode,
at least one portion of the first part of the second electrode overlaps with the gate electrode, and
the second part of the second electrode does not overlap with and is separated from the gate electrode.

8. The organic luminescence display of claim 7, wherein both the first electrode and the second electrode overlap with the active layer.

9. The organic luminescence display of claim 7, wherein the first hole is formed to overlap with the gate electrode, and the second hole is formed not to overlap with and is separated from the gate electrode.

10. The organic luminescence display of claim 7, wherein the active layer comprises an oxide semiconductor.

11. The organic luminescence display of claim 7, wherein the oxide semiconductor comprises at least one selected from the group consisting of indium (In), gallium (Ga), stanium (Sn), zirconium (Zr), vanadium (V), hafnium (Hf), zinc (Zn), and a combination thereof 12. The organic luminescence display of claim 7, wherein the active layer is configured to form a back channel at a region of the active layer which overlaps with the first part of the second electrode but does not overlap with the gate electrode.

13. A method of manufacturing an organic luminescence display, the method comprising:
providing a substrate;
forming a gate electrode over the substrate;
forming an active layer which is insulated from the gate electrode by a gate insulation film;
forming an etch stop layer over the active layer, the etch stop layer comprising a first hole and a second hole for exposing the active layer;
forming a first electrode comprising a first part and a second part, wherein the first part is formed over the etch stop layer, and the second part which is received in the first hole, contacts the active layer directly, and connects the first part to the active layer;
forming a second electrode comprising a first part and a second part, wherein the first part is formed over the etch stop layer, and the second portion is received in the second hole, contacts the active layer directly, and connects the first part to the active layer;
forming a pixel electrode connected to either the first electrode or the second electrode;
forming an opposite electrode facing the pixel electrode; and
forming an organic luminescence layer between the pixel electrode and the opposite electrode,
wherein at least one portion of the first part of the first electrode and the second part of the first electrode overlap with the gate electrode,
the first part of the second electrode at least partially overlaps with the gate electrode, and
the second part of the second electrode does not overlap with and is separated from the gate electrode.

14. The method of claim 13, wherein both the first electrode and the second electrode overlap with the active layer.

15. The method of claim 13, wherein the first hole is formed to overlap with the gate electrode, and the second hole is formed not to overlap with and is separated from the gate electrode.

16. The method of claim 13, wherein the active layer comprises an oxide semiconductor.

17. The method of claim 13, wherein the oxide semiconductor comprises at least one selected from the group consisting of indium (In), gallium (Ga), stanium (Sn), zirconium (Zr), vanadium (V), hafnium (Hf), zinc (Zn), and a combination thereof 18. The method of claim 13, further comprising forming a buffer layer between the substrate and the gate electrode.

* * * * *